(12) United States Patent
Sung et al.

(10) Patent No.: US 6,828,183 B1
(45) Date of Patent: Dec. 7, 2004

(54) PROCESS FOR HIGH VOLTAGE OXIDE AND SELECT GATE POLY FOR SPLIT-GATE FLASH MEMORY

(75) Inventors: Hung Cheng Sung, Hsin-Chu (TW); Han-Ping Chen, Hsin-Chu (TW); Cheng Yuan Hsu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/120,834

(22) Filed: Apr. 11, 2002

(51) Int. Cl.⁷ .......................................... H01L 21/8238
(52) U.S. Cl. ....................... 438/201; 438/211; 438/257; 257/314; 257/315
(58) Field of Search ................................ 438/593, 241, 438/201, 211, 257 V, 261–266, 257–258; 257/314–316, 319–320

(56) References Cited

U.S. PATENT DOCUMENTS

| | | | |
|---|---|---|---|
| 5,776,810 A | 7/1998 | Guterman et al. | 438/258 |
| 5,851,881 A | 12/1998 | Lin et al. | 438/261 |
| 5,861,347 A * | 1/1999 | Maiti et al. | 438/787 |
| 5,940,706 A | 8/1999 | Sung et al. | 438/261 |
| 5,970,371 A | 10/1999 | Hsieh et al. | 438/593 |
| 6,010,929 A | 1/2000 | Chapman | 438/226 |
| 6,017,795 A | 1/2000 | Hsieh et al. | 438/262 |
| 6,121,087 A * | 9/2000 | Mann et al. | 438/258 |
| 6,177,362 B1 * | 1/2001 | Huang et al. | 438/787 |
| 6,274,411 B1 * | 8/2001 | Patelmo et al. | 438/142 |
| 6,306,690 B1 * | 10/2001 | Kaya et al. | 438/136 |
| 6,340,828 B1 * | 1/2002 | Libera et al. | 257/321 |
| 6,350,652 B1 * | 2/2002 | Libera et al. | 438/257 |
| 6,429,073 B1 * | 8/2002 | Furuhata et al. | 438/258 |
| 6,537,869 B1 * | 3/2003 | Furuhata | 438/239 |
| 6,563,168 B2 * | 5/2003 | Lee | 257/316 |
| 6,573,130 B1 * | 6/2003 | Patelmo et al. | 438/201 |
| 6,589,843 B1 * | 7/2003 | Beaman | 438/261 |
| 2001/0045590 A1 * | 11/2001 | Kobayashi | 257/298 |
| 2002/0000605 A1 * | 1/2002 | Liu et al. | 257/316 |
| 2002/0016040 A1 * | 2/2002 | Iida | 438/258 |
| 2002/0115254 A1 * | 8/2002 | Furuhata | 438/257 |
| 2002/0127799 A1 * | 9/2002 | Kim | 438/257 |
| 2002/0146883 A1 * | 10/2002 | Furuhata | 438/257 |

* cited by examiner

*Primary Examiner*—Long Pham
*Assistant Examiner*—Thao X. Le
(74) *Attorney, Agent, or Firm*—Thomas, Kayden, Horstemeyer & Risley

(57) ABSTRACT

A process for forming a high voltage oxide (HV) and a select gate poly for a split-gate flash memory is disclosed. The general difficulty of forming oxides of two different thicknesses for two different areas on the same substrate is alleviated by forming an HV oxide layer over the entire substrate just prior to the forming of the control gate of a cell area after the forming of a gate oxide layer over the peripheral area of the substrate. At an immediate subsequent step, a peripheral gate is formed over the HV oxide over the peripheral area, and, as a final step, the forming of the control gate, or the select gate of the cell area follows next.

38 Claims, 3 Drawing Sheets

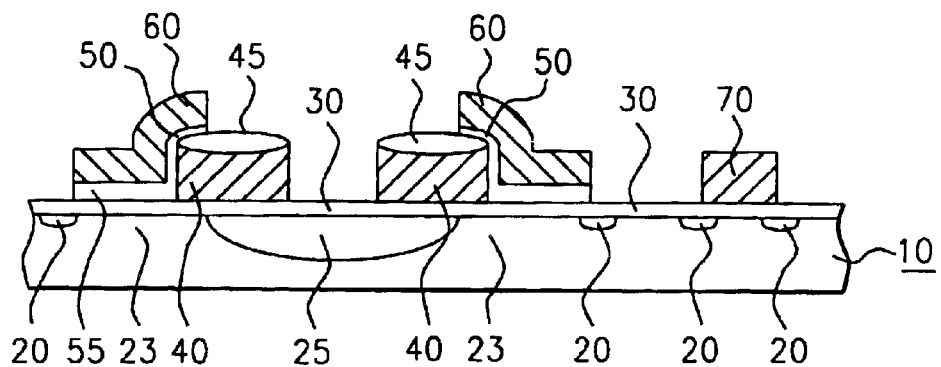
FIG. 1 - Prior Art
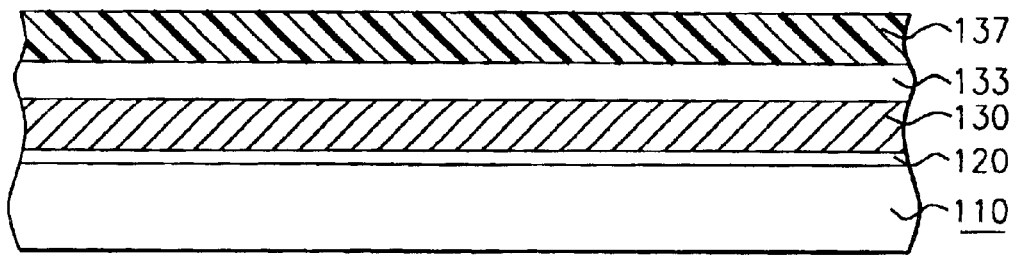
FIG. 2a
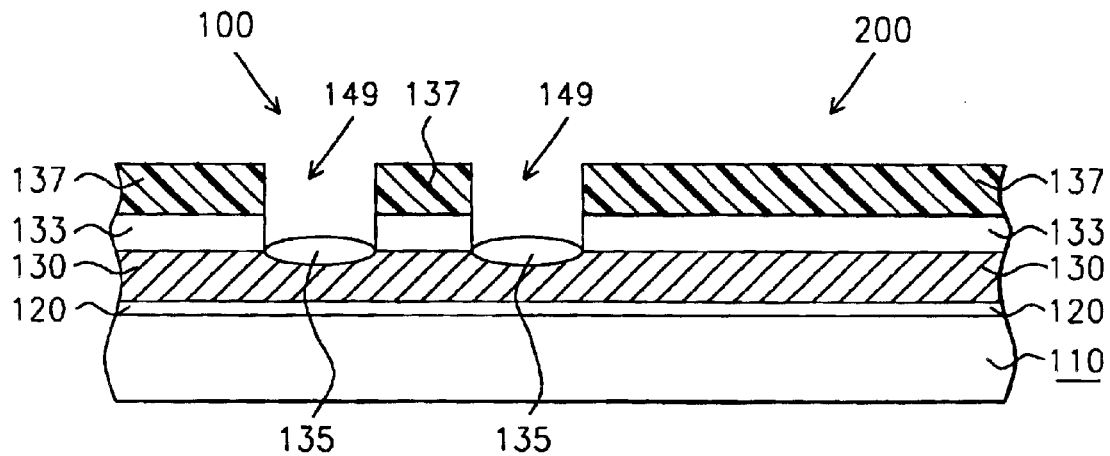
FIG. 2b

PROCESS FOR HIGH VOLTAGE OXIDE AND SELECT GATE POLY FOR SPLIT-GATE FLASH MEMORY

BACKGROUND OF THE INVENTION (1) Field of the Invention

The present invention relates to the manufacture of semiconductor devices in general, and in particular, to a method of forming a high voltage oxide and a select gate poly for a split-gate flash memory cell.

(2) Description of the Related Art

Oxide thickness plays an important role both in terms of electrical strength as well as providing physical isolation between conductive regions in a semiconductor device. More often than not, an oxide layer of a given thickness is formed at once, and the same oxide layer is used for two different components in the same device. A case in point is the portion of the same oxide layer that is used in the forming of the gate oxide of a select transistor in a conventional split-gate memory cell—which will be described in more detail later—that is also used as the gate oxide of a high voltage peripheral transistor.

Thus, in FIG. 1, where a split-gate flash memory cell is shown, oxide layer (30) is formed over substrate (10), and it extends to a peripheral transistor (70). Oxide layer can be gate oxide and tunnel oxide. However, normally transistor (70) is a high voltage transistor and requires a thicker oxide. If a thicker oxide is formed throughout, then the thicker oxide causes poor current drive for the select transistor (60) shown in FIG. 1, under low voltage operating conditions. It is sometimes the conventional practice to extend the secondary oxide layer (55) shown in FIG. 1 to provide a thicker oxide under transistor (70). However, the resulting oxide thickness is not necessarily the optimized thickness needed for the peripheral transistor, namely, (70). It is disclosed in the present invention a method of forming an optimized high voltage (HV) oxide for a peripheral HV transistor independent of the oxide thicknesses required in other portions, such as for the select transistor, of a split-gate flash memory cell. It is also disclosed that the doping of the HV transistor can be optimized independently of the doping for the select transistor of the flash memory cell.

Memory devices include electrically erasable and electrically programmable read-only memories (EEPROMS) of flash electrically erasable and electrically programmable read-only memories (flash EEPROMs). Most conventional flash-EEPROM cells use a double-polysilicon (poly) structure of which the well known split-gate cell is shown in FIG. 1. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). As is known in the art, control gate serves the function of a select transistor. Substrate (10) and channel region (23) have a first conductivity type, and the first (20) and second (25) doped regions have a second conductivity type that is opposite the first conductivity type. In the conventional split-gate flash memory cell shown in FIG. 1, the same gate oxide thickness prevails throughout the substrate, including the HV transistor (70) area.

Different oxide thickness requirements for different areas in the same semiconductor substrate is propelled even more with advances in the ultra large scale integrated (ULSI) circuits. Device geometries of integrated circuits are continually made smaller so that the device density of the entire system can be maximized. This results in, for example, transistors within integrated devices such as MOSFETS having shorter and sorter gate lengths. This in turn necessitates a reduction in gate oxide thickness and operating supply voltage in order to support the minimum gate length without excessively high threshold voltages. The minimum allowable gate oxide thickness for a given device is limited by the time dependent dielectric breakdown of the thin oxide at the desired operating voltage. As a result, the operating voltages applied to the gates of transistors within a particular device must be reduced as the gate oxides within these devices are reduced in thickness, as is known in the art.

Furthermore, it has become necessary to integrate different gate oxide thicknesses onto a single integrated circuit device. This is because, high performance transistors require thinner gate dielectric regions and operate at lower voltages (e.g. 1.8 volts to 2.5 volts), whereas most conventional external peripherals typically require higher operating voltages such as 3.3 volts to 5.0 volts. When interfacing lower voltage high performance MOS transistors to higher voltage devices, input and output (I/O) buffers of the integrated circuit (IC) are typically designed to contain thicker gate dielectric regions that are compatible with the higher external peripheral device voltages. In addition, current microcontroller units (MCUs) and digital signal processors (DSPs) are integrating several different types of technology onto a single integrated circuit. For example, high speed logic, power logic, static random access memory (SRAM), nonvolatile memory (NVM), embedded dynamic random access memory (DRAM), analog circuitry, and other devices and technologies are now being considered for integration onto the same integrated circuit die. Many of these devices require different gate dielectric processing and different gate dielectric thicknesses.

Forming of gate oxide layers having two different thicknesses on the same substrate can be difficult. In U.S. Pat. No. 6,010,929, Chapman teaches a method of forming high voltage (HV) and low voltage (LV) transistors on the same substrate. Hsieh, et al., teach a process for a split-gate flash cell. In another U.S. Pat. No. 5,970,3171, Hsieh, et al., show another method of forming a split-gate flash EEPROM with sharp beak of poly. A split-gate with a source side injection is proposed by Guterman, et al., in U.S. Pat. No. 5,776,810. Lin, et al, in U.S. Pat. No. 5,851,81 and Sung, et al., in U.S. Pat. No. 5,940,706 also show related split-gate flash cell methods.

Thus, conventionally, photolithographic techniques are employed to pattern separately the oxides that are to have different thicknesses. It is often the case, however, that with the required two different oxide thicknesses, there are times when a photoresist mask is placed in proximity to the bare semiconductor substrate. The photoresist is known to cause degradation of the surface of the substrate, which is not desirable especially in the area intended to be used for high performance transistors. It is disclosed in the embodiments of the present invention a method of forming an optimized thickness oxide for a peripheral high voltage transistor without affecting the performance of a split-gate flash memory cell.

SUMMARY OF THE INVENTION

It is therefore an object of the present invention to provide a method of forming a high voltage oxide and a select gate poly for a split-gate flash memory cell.

It is another object of the present invention to provide a method of forming two different oxides for two different areas on the same substrate.

It is still another object of the present invention to provide a method of forming an optimized oxide thickness for a high voltage transistor independently of the thickness required for a select transistor of a memory cell.

It is yet another object of the present invention to provide method of optimizing the doping characteristics of a select transistor of a cell independently of that of a peripheral transistor.

These objects are accomplished by providing a substrate having a cell area and a peripheral area; forming a gate oxide layer over said substrate; forming a first polysilicon layer over said first gate oxide layer; forming a nitride layer over said first polysilicon layer; forming a first photoresist layer over said nitride layer; patterning said first photoresist layer to define floating gate in said cell area; etching said nitride layer through said patterning in said first photoresist layer and forming opening in said nitride layer reaching said first polysilicon layer; removing said first photoresist layer; performing thermal oxidation of said first polysilicon layer exposed in said opening reaching said first polysilicon layer to form poly-oxide; removing said nitride layer; etching said first polysilicon layer using said poly-oxide as a hard mask to form a floating gate in said cell area and removing said first polysilicon layer from said peripheral area; forming a second photoresist layer over said substrate and patterning to define source region in said cell area; performing ion implantation through opening in said second patterned photoresist mask to form source region in said cell area within said substrate; removing said second photoresist layer; forming a tunneling oxide layer over said floating gate in said cell area; forming a second cell polysilicon layer over said tunneling oxide layer over said cell area; growing an HV oxide layer over said substrate including over said cell polysilicon layer over said cell area and over said gate oxide layer over said peripheral area; forming a peripheral polysilicon layer over said HV oxide layer over said peripheral area; forming a third photoresist layer over said substrate to have patterns corresponding to a control gate over said cell area and a peripheral gate over said peripheral area; etching said peripheral polysilicon layer through said patterns in said third photoresist layer to form said peripheral gate over said HV oxide layer over said peripheral area; and etching said second cell polysilicon layer through said patterns in said third photoresist layer to form said control gate over said tunneling oxide layer over said cell area.

BRIEF DESCRIPTION OF THE DRAWINGS

FIG. 1 is a partial cross-sectional view of a semiconductor substrate showing the structure of a conventional split-gate memory cell having a memory cell sharing the same thickness gate oxide with a peripheral transistor, according to prior art.

FIG. 2a is a partial cross-sectional view of a semiconductor substrate showing the forming of a gate oxide layer followed by a first polysilicon layer followed by a nitride layer, and a photoresist layer, over a cell area and a contiguous peripheral area, according to this invention.

FIG. 2b is a partial cross-sectional view of the substrate of FIG. 2a showing the forming of polyoxide over the floating gates that are to be formed in the cell area of this invention.

DESCRIPTION OF THE PREFERRED EMBODIMENTS

Figure 2C:
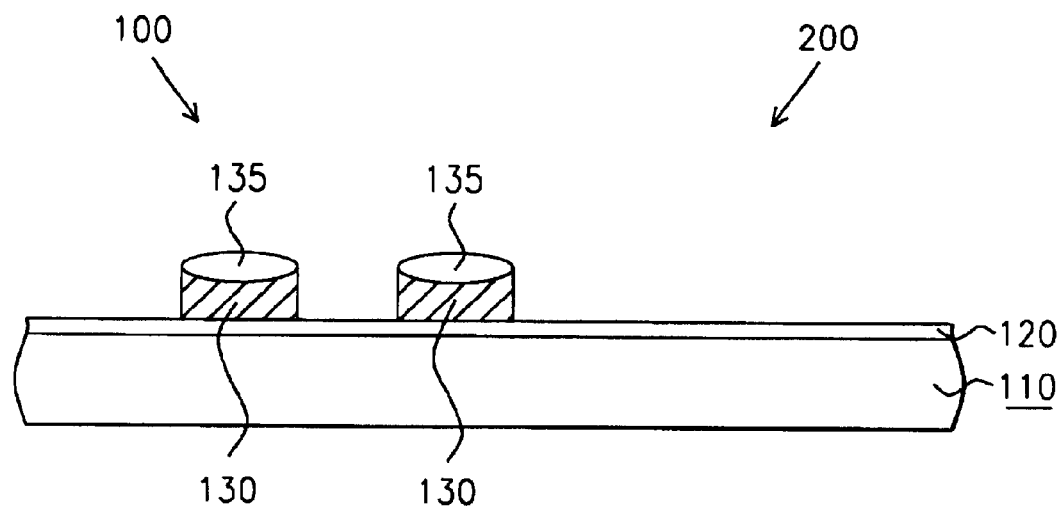
FIG. 2c is a partial cross-sectional view of the substrate of FIG. 2b showing the forming of floating gates in the cell area of this invention.

Referring now to the drawings, FIGS. 2a–2f show a method of forming a high voltage (HV) oxide and a select transistor poly for a split-gate flash memory cell. That is, the figures disclose the forming of different oxides for two different areas on the same substrate. In this manner, the oxide thickness required for one area can be optimized independently of the oxide for the other area.

In FIG. 2a, substrate (110), preferably silicon, is provided with cell area (100) and a contiguous peripheral area (200). A gate oxide layer (120) of thickness between about 80 to 150 angstroms (Å) is first formed on substrate (110). Gate oxide (120) can be formed by thermal oxidation process at a temperature between about 800° C. to 1000° C. Alternatively, the gate oxide can be formed by an atmospheric or low pressure chemical vapor deposition (LPCVD) process as is well known.

Next, first polysilicon layer (130) is formed over gate oxide layer (120) as shown in FIG. 2b. This is accomplished through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 600 to 650° C. The preferred thickness of the first polysilicon layer is between about 700 to 1500 Å. This is followed by the deposition of nitride layer (133) using dichlorosilane ($SiCl_2H_2$) with ammonia ($NH_3$) in an LPCVD at a temperature between about 780 to 800° C. The preferred thickness of the nitride layer is between about 1700 to 2000 Å.

Figure 2D:
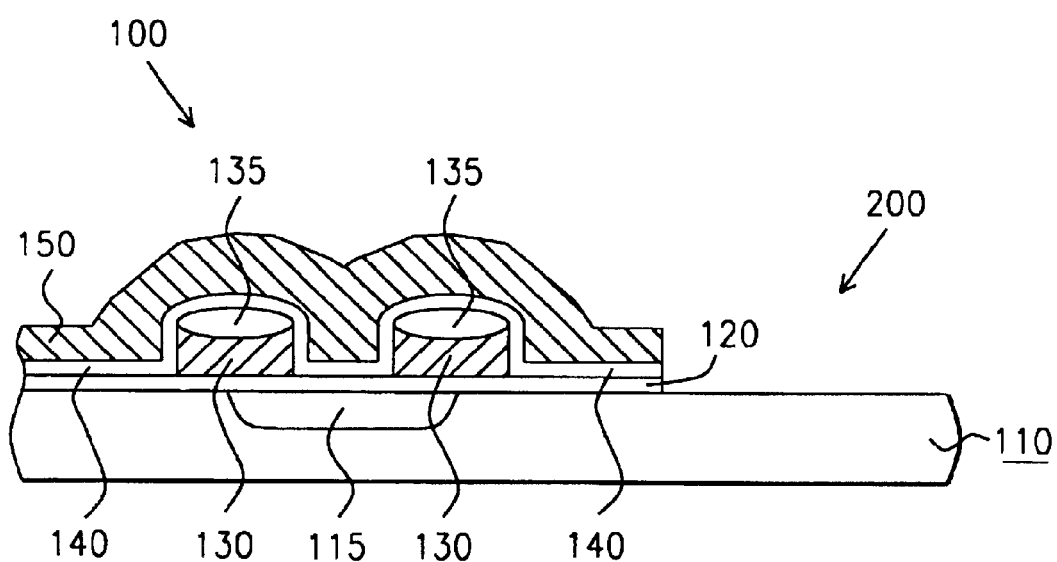
FIG. 2d is a partial cross-sectional view of a substrate showing the forming of a second polysilicon layer over the floating gate over the cell area of FIG. 2c, according to this invention.

A first photoresist layer, (137), is next formed and patterned to define the floating gate regions over the substrate as shown in FIG. 2b. The pattern openings (149), are dry etched into the nitride layer until the underlying polysilicon layer (130) is exposed. The etching of nitride layer is accomplished with etch recipe comprising gases Ar, $CHF_3$ and $C_4F_8$. Subsequently, photoresist layer (137) is removed, and using patterned nitride layer (133), the exposed portions of first polysilicon layer (130) are oxidized. That is, the exposed first polysilicon layer in the floating gate pattern openings in the nitride layer are oxidized in a wet environment and at a temperature between about 800 to 950° C. to form poly-oxide "caps" (135) shown in FIG. 2d, with a preferred thickness between about 500 to 1500 Å. After the poly oxidation, the nitride layer is removed by applying a wet solution of phosphoric acid, $H_3PO_4$. Using the poly-oxide layer as a hard mask, the first polysilicon layer is etched using a recipe comprising HBr, $Cl_2$, He and $O_2$ gases thus forming polysilicon floating gates (130) as shown in FIG. 2d. It will be noted that the first polysilicon layer over peripheral area (200) is removed until gate oxide layer (120) is exposed, as shown in the same Figure.

Next, source implantation is performed after the forming of floating gate (130). This is accomplished, first, by forming a second photoresist layer (not shown) over the substrate and implanting cell source area (115) as shown in FIG. 2d, preferably, by using phosphorous ions with a dosage between about $5\times10^{14}$ to $5\times10^{15}$ atoms/cm$^2$ and at an energy between about 15 to 30 KeV. Photoresist layer is then removed, and tunnel oxide layer (140) is deposited to a thickness between about 150 to 200 Å. It is preferred that the tunnel oxide comprises high temperature oxide (HTO).

Next, second polysilicon layer (150) is formed over the substrate, including the tunnel oxide, preferably, through the previous LPCVD method employing silane SiH$_4$ as a silicon source material at a temperature range between about 600 to 650° C. The preferred thickness is between about 2000 to 2500 Å. It will be noted in FIG. 2d that the second polysilicon layer is removed from the peripheral area.

Figure 2E:
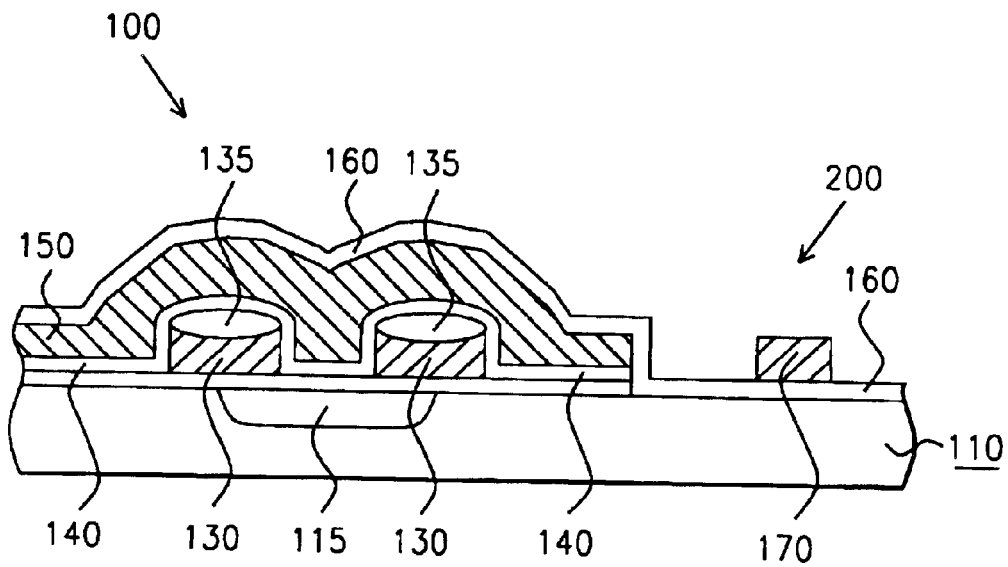
FIG. 2e is a partial cross-sectional view of the substrate of FIG. 2d showing the forming of a key feature of this invention, namely, of a high voltage (HV) oxide to serve as the gate oxide of a HV transistor to be formed in the peripheral area of the present invention.

As a main feature and key aspect of the present invention, high voltage (HV) oxide layer (160) is next formed over the substrate including over the second polysilicon layer in cell area (100), and the peripheral area (200), as shown in, FIG. 2e. The thickness of the HV oxide here can be optimized to which it is required for the desired operation of the HV transistor to be formed in a later step. In other words, in contrast with conventional methods, the instant HV oxide, layer (160), for the peripheral transistor can be formed independently of the thickness of gate oxide layer (120) required for the floating gate transistor of the split-gate flash memory cell of the present invention. It will be noted that of the previously formed gate oxide layer (120) and tunnel oxide layer (140), neither one of them separately, nor both together will yield the optimized thickness of the high voltage layer that is needed for the high voltage transistor to be formed as reference (170) shown in FIG. 2e. It is important that the preferred thickness for the HV oxide layer of this invention is between about 150 to 250 Å.

Generally, forming oxide layers are known in the art and can be formed such as by reacting dichlorosilane with nitrous oxide at a temperature between about 600 to 800° C. Also, methods including but not limited do chemical vapor deposition (CVD), plasma enhanced CVD (PECVD), or, physical vapor deposition (PVD) methods can be used. For the preferred embodiment of the present invention, HV oxide layer (160) is preferably formed by thermal oxidation at a temperature between about 800 to 950° C.

After the forming of HV oxide layer (160), a peripheral polysilicon layer is formed over peripheral area (200) and then etched to form peripheral transistor (170) shown in FIG. 2e. Peripheral polysilicon (not shown as a layer) is formed by an LPCVD method employing silane SiH$_4$ as a silicon source material at a temperature range between about 600 to 650° C. The preferred thickness of the peripheral polysilicon layer is between about 2000 to 2500 Å.

Figure 2F:
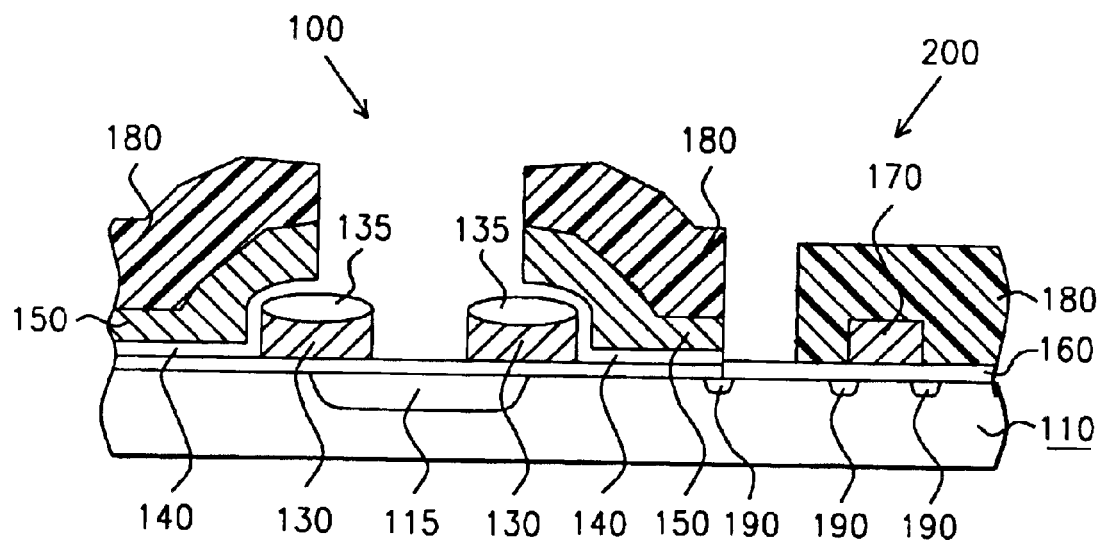
FIG. 2f is a partial cross-sectional view of the substrate of FIG. 2e showing the forming of a select transistor along with the peripheral transistor of the present invention, each having independently formed gate oxide layers of appropriately optimized thicknesses, according to the present invention.

Then, a third photoresist, layer (180) in FIG. 2f, is formed over the substrate to define the control gate of select transistor (150) of the memory in cell area (100), as well as the HV transistor in peripheral area (200) shown in the same Figure. This is followed, as a final step, by the implanting of regions (190) in substrate (110) shown in FIG. 2f for the select transistor and the peripheral transistor. The implantation is accomplished with arsenic (As) ions at a dosage level between about $3\times10^{15}$ to $5\times10^{15}$ atoms/cm$^2$ and energy level between about 30 to 50 KeV. It will be appreciated by those skilled in the art that doping of the polysilicon for the select transistor and for the peripheral transistor can be accomplished independent of each other at different steps, and hence provide the optimum characteristics for each of the transistors individually.

While invention has been particularly shown and described with reference to the preferred embodiments thereof, it will be understood by those skilled in the art that various changes in form and details may be made without departing from the spirit and scope of the invention.

What is claimed is:

1. A method of forming a high voltage (HV) oxide and peripheral gate for a split-gate flash memory comprising the steps of:

providing a semiconductor substrate having a cell area and a peripheral area;

forming a first oxide layer over said substrate;

forming a floating gate transistor over said first oxide layer over said cell area;

forming a second oxide layer over said floating gate transistor, said second oxide serving as a tunnel oxide;

forming a first source region in said substrate for said floating gate transistor;

forming a cell polysilicon layer over said cell area over said substrate including said second oxide layer;

growing a third oxide layer over said substrate including over said cell polysilicon layer and over said peripheral area, said third oxide serving as said high voltage (HV) oxide;

forming a peripheral polysilicon layer over said HV oxide layer over said peripheral area;

forming a peripheral transistor comprising said peripheral polysilicon layer over said HV oxide layer over said peripheral area;

forming a control gate in said cell polysilicon layer by etching said cell polysilicon layer over said first source region over said cell area;

forming a second source region for said peripheral transistor.

2. The method of claim 1, wherein said gate oxide layer has a thickness between about 150 to 250 Å.

3. The method of claim 1, wherein said floating gate is formed by employing silane SiH$_4$ as a silicon source material at a temperature range between about 600 to 650° C.

4. The method of claim 1, wherein said floating gate has a thickness between about 700 to 1500 Å.

5. The method of claim 1, wherein said tunnel oxide comprises high temperature oxide (HTO) having a thickness between about 150 to 200 Å.

6. The method of claim 1, wherein said cell polysilicon layer is formed by employing silane SiH$_4$ as a silicon source material at a temperature range between about 600 to 650° C.

7. The method of claim 1, wherein said cell polysilicon layer has a thickness between about 2000 to 2500 Å.

8. The method of claim 1, wherein said HV oxide layer is formed by thermal oxidation at a temperature between about 800 to 950° C.

9. The method of claim 1, wherein said HV oxide layer has a thickness between about 150 to 250 Å.

10. The method of claim 1, wherein said peripheral polysilicon layer is formed by employing silane SiH$_4$ as a silicon source material at a temperature range between about 600 to 650° C.

11. The method of claim 1, wherein said peripheral gate has a thickness between about 2000 to 2500 Å.

12. The method of claim 1, wherein said control gate has a thickness between about 2000 to 2500 Å.

13. A method of forming a high voltage (HV) oxide and select gate poly for a split-gate flash memory comprising the steps of:

providing a substrate having a cell area and a peripheral area;

forming a gate oxide layer over said substrate;

forming a first polysilicon layer over said gate oxide layer;

forming a nitride layer over said first polysilicon layer;

forming a first photoresist layer over said nitride layer;

patterning said first photoresist layer to define a floating gate in said cell area;

etching said nitride layer through said patterning in said first photoresist layer and forming an opening in said nitride layer reaching said first polysilicon layer;

removing said first photoresist layer;

performing thermal oxidation of said first polysilicon layer exposed in said opening reaching said first polysilicon layer to form poly-oxide;

removing said nitride layer;

etching said first polysilicon layer using said poly-oxide as a hard mask to form a floating gate in said cell area and removing said first polysilicon layer from said peripheral area;

forming a second photoresist layer over said substrate and patterning to define a source region in said cell area;

performing ion implantation through opening in said second patterned photoresist mask to form said source region in said cell area within said substrate;

removing said second photoresist layer;

forming a tunnel oxide layer over said floating gate in said cell area;

forming a second cell polysilicon layer over said tunnel oxide layer over said cell area;

forming photoresist layer over said cell region, opening said peripheral area by removing said second cell polysilicon, said tunnel oxide layer and said gate oxide in said peripheral area;

growing an HV oxide layer over said substrate including over said cell polysilicon layer over said cell area and over said peripheral area;

forming a peripheral polysilicon layer over said HV oxide layer over said peripheral area;

forming a third photoresist layer over said substrate having patterns corresponding to a control gate over said cell area and a peripheral gate over said peripheral area;

etching said peripheral polysilicon layer through said patterns in said third photoresist layer to form said peripheral gate over said HV oxide layer over said peripheral area; and etching said second cell polysilicon layer through said patterns in said third photoresist layer to form Said control gate over said tunnel oxide layer over said cell area.

14. The method of claim 13, wherein said substrate is silicon.

15. The method of claim 13, wherein said gate oxide layer has a thickness between about 80 to 100 Å.

16. The method of claim 13, wherein said forming a first polysilicon layer is accomplished with silicon source $SiH_4$, using LPCVD at a temperature between about 600 to 650° C.

17. The method of claim 13, wherein said first polysilicon layer has a thickness between about 700 to 1500 Å.

18. The method of claim 13, wherein said forming a nitride layer is accomplished by CVD at a temperature between about 750 to 800° C. by reacting dichlorosilane ($SiCl_2H_2$) with ammonia ($NH_3$).

19. The method of claim 13, wherein said nitride layer has a thickness between about 1900 to 2000 Å.

20. The method of claim 13, wherein said etching said nitride layer is accomplished with etch recipe comprising gases Ar, $CHF_3$, $C_4F_8$.

21. The method of claim 13, wherein said performing thermal oxidation of said first polysilicon layer to form poly-oxide with a thickness between about 500 to 1500 Å is accomplished by wet oxidation at a temperature between about 800 to 950° C.

22. The method of claim 13, wherein said removing said nitride layer is accomplished with a wet solution comprising $H_3PO_4$.

23. The method of claim 13, wherein said etching said first polysilicon layer using said poly-oxide as a mask is accomplished with a recipe comprising gases HBr, $Cl_2$, He and $O_2$.

24. The method of claim 13, wherein said performing said ion implantation through said opening in said second patterned photoresist mask to form source region in said cell area is accomplished by implanting phosphorous ions with a dosage between about $5 \times 10^{14}$ to $5 \times 10^{15}$ atoms/cm$^2$ and at an energy between about 15 to 30 KeV.

25. The method of claim 13, wherein said tunnel oxide comprises HTO having a thickness between about 150 to 200 Å.

26. The method of claim 13, wherein said forming second polysilicon layer over said tunnel oxide is accomplished with silicon source $SiH_4$ using LPCVD at a temperature between about 600 to 650° C.

27. The method of claim 13, wherein said second polysilicon layer has a thickness between about 2000 to 2500 Å.

28. The method of claim 13, wherein said HV oxide layer comprises thermal oxidation and is formed at a temperature between about 800 to 950° C.

29. The method of claim 13, wherein said HV oxide layer has a thickness between about 150 to 250 Å.

30. The method of claim 13, wherein said forming said peripheral polysilicon layer over said HV oxide layer over said peripheral area is accomplished with silicon source $SiH_4$ using LPCVD at a temperature between about 600 to 650° C.

31. The method of claim 13, wherein said peripheral polysilicon layer has a thickness between about 2000 to 2500 Å.

32. The method of claim 13, wherein said etching said peripheral polysilicon layer to form said peripheral gate is accomplished with a recipe comprises gases HBr, $Cl_2$, He and $O_2$.

33. The method of claim 13, wherein said etching said cell polysilicon layer to form said control gate is accomplished with a recipe comprising gases HBr, $Cl_2$, He and $O_2$.

34. A method of forming a high voltage (HV) oxide and select gate poly for a split-gate flash memory comprising the steps of:

providing a semiconductor substrate having a ceil area and a peripheral area;

forming a first oxide layer over said substrate;

forming a floating gate over said first oxide layer over said cell area;

forming a second oxide layer over said floating gate transistor and over said peripheral area;

forming a first polysilicon layer over said second oxide layer;

selectively etching said first polysilicon layer, said second oxide layer, and said first oxide layer over said peripheral area to expose the substrate surface;

forming a third oxide layer on said exposed substrate surface in said peripheral area and on said first polysilicon layer in said cell area, wherein said third oxide layer serves as a HV transistor dielectric in the peripheral area;

forming a second polysilicon layer over said semiconductor substrate;

selectively etching said second polysilicon layer to form a peripheral gate transistor in said peripheral area and to expose said third oxide layer in said cell area; and selectively etching said third oxide layer and first polysilicon layer to form a control gate transistor in said cell area.

35. The method according to claim 34, wherein said first oxide layer comprises gate oxide having a thickness between about 150 to 200 Å.

36. The method according to claim 34, wherein said second oxide layer comprises HTO having a thickness between about 150 to 250 Å.

37. The method according to claim 34, wherein aid first polysilicon layer has a thickness between about 2000 to 2500 Å.

38. The method according to claim 34, wherein said second polysilicon layer has a thickness between about 2000 to 2500 Å.

\* \* \* \* \*